US012787777B2

(12) United States Patent
Santolaria et al.

(10) Patent No.: US 12,787,777 B2
(45) Date of Patent: Nov. 3, 2026

(54) FLOW INVERTER AND POWER SEMICONDUCTOR COMPONENT

(71) Applicant: Hitachi Energy Ltd, Zürich (CH)

(72) Inventors: Lluis Santolaria, Olten (CH); Milad Maleki, Untersiggenthal (CH)

(73) Assignee: HITACHI ENERGY LTD, Zurich (CH)

( * ) Notice: Subject to any disclaimer, the term of this patent is extended or adjusted under 35 U.S.C. 154(b) by 308 days.

(21) Appl. No.: 18/719,794

(22) PCT Filed: Dec. 1, 2022

(86) PCT No.: PCT/EP2022/084041

§ 371 (c)(1),
(2) Date: Jun. 13, 2024

(87) PCT Pub. No.: WO2023/110431

PCT Pub. Date: Jun. 22, 2023

(65) Prior Publication Data

US 2025/0054836 A1 Feb. 13, 2025

(30) Foreign Application Priority Data

Dec. 14, 2021 (EP) .................................... 21214313

(51) Int. Cl.
*H10W 40/40* (2026.01)
*F28F 13/06* (2006.01)
*H10W 90/00* (2026.01)

(52) U.S. Cl.
CPC ............. *H10W 40/40* (2026.01); *F28F 13/06* (2013.01); *H10W 90/00* (2026.01)

(58) Field of Classification Search
CPC ........ H10W 40/40; H10W 90/00; F28F 13/06
(Continued)

(56) References Cited

U.S. PATENT DOCUMENTS 5,158,136 A 10/1992 Azar
2009/0057882 A1 * 3/2009 Gerbsch ................ H10W 40/47
257/E23.098

(Continued)

FOREIGN PATENT DOCUMENTS

CN 101483173 A 7/2009
CN 203340517 U 12/2013

(Continued)

*Primary Examiner* — Igwe U Anya
(74) *Attorney, Agent, or Firm* — PROCOPIO, CORY, HARGREAVES & SAVITCH LLP

(57) ABSTRACT

A flow inverter (1) for a coolant substance (18) for a power semiconductor component (16) is specified, comprising —a first plate (2) extending along a main extension plane of the flow inverter (1), —a second plate (3) extending along the main extension plane, —a first wall (4) provided on the first plate (2) and the second plate (3) from a first main side of the flow inverter (1), and —a second wall (5) provided on the first plate (2) and the second plate (3) from a second main side of the flow inverter (1) opposite the first main side, wherein —the first plate (2) is provided next to the second plate (3), —at least one first recess (6) is provided between the first plate (2) and the second plate (3), and —at least one second recess (7) is provided between the first plate (2) and the second plate (3). Further, a power semiconductor component (16) is specified.

15 Claims, 3 Drawing Sheets

Figure 1:
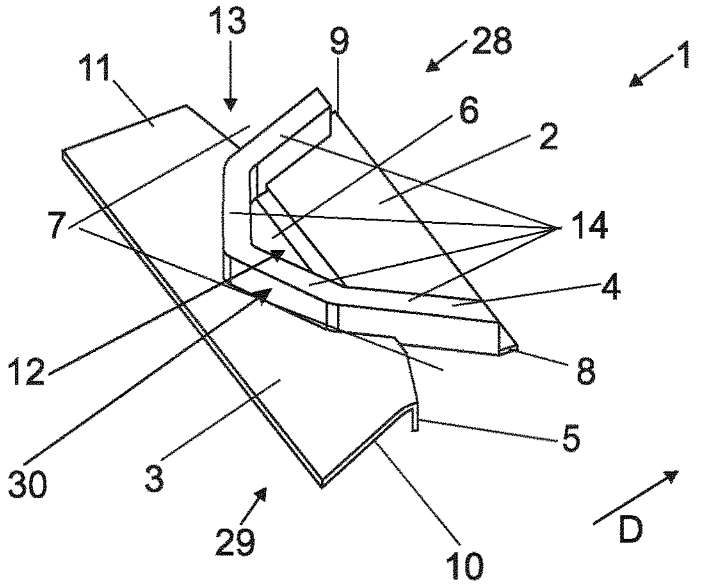

(58) Field of Classification Search
USPC .......................................................... 257/713
See application file for complete search history.

(56) References Cited

U.S. PATENT DOCUMENTS

| | | | | | |
|---|---|---|---|---|---|
| 2009/0178788 | A1* | 7/2009 | Kimura | H10W 40/47 | 165/104.33 |
| 2012/0139096 | A1* | 6/2012 | Gohara | H10W 40/255 | 257/E23.101 |
| 2014/0124182 | A1* | 5/2014 | Kwak | H10W 40/47 | 165/168 |

FOREIGN PATENT DOCUMENTS

| | | | |
|---|---|---|---|
| DE | 102009004097 | A1 | 8/2009 |
| EP | 1898464 | A1 | 3/2008 |
| EP | 2034521 | A2 | 3/2009 |
| EP | 2597676 | A2 | 5/2013 |
| EP | 2744316 | A2 | 6/2014 |
| JP | 61134042 | U | 8/1986 |
| JP | 623257 | U | 3/1994 |
| JP | 2001308246 | A | 11/2001 |
| JP | 2002315357 | A | 10/2002 |
| JP | 2007-5673 | A | 1/2007 |
| JP | 2012-33966 | A | 2/2012 |
| JP | 2021-57370 | A | 4/2021 |
| WO | 2020178131 | A1 | 9/2020 |

* cited by examiner

FLOW INVERTER AND POWER SEMICONDUCTOR COMPONENT

The present disclosure relates to a flow inverter for a coolant substance for a power semiconductor component and a power semiconductor component.

Embodiments of the disclosure relate to a flow inverter, which can provide an improved cooling efficiency. Further embodiments of the disclosure relate to a power semiconductor component.

This is achieved by the subject-matter of the independent claims. Further embodiments are evident from the dependent claims in the following description.

A first aspect relates to a flow inverter for a coolant substance for a power semiconductor component. The term “power” here and in the following, for example, refers to power semiconductor components, power semiconductor modules and/or power semiconductor chips adapted for processing voltages and currents of more than 100 V and/or more than 10 A, exemplary voltages up to 6.5 kV and currents of amperes up to 3600 A.

The coolant substance is, for example, a liquid coolant or a gas coolant. Exemplarily, heat generated during operation of the power semiconductor modules can be effectively dissipated away via the coolant substance.

The flow inverter has, for example, a main extension plane. Lateral directions are aligned parallel to the main extension plane and a vertical direction is aligned perpendicular to the main extension plane.

According to an embodiment, the flow inverter comprises a first plate extending along a main extension plane of the flow inverter. For example, the first plate extends substantially along the lateral directions. Here and in the following “substantially” means that the first plate can enclose an angle with the main extension plane of at most 30° or 15°, e.g. 5° or 1°. Exemplary, the first plate extends parallel to the lateral directions.

For example, the first plate comprises or consists of a metal or a polymer. Exemplarily the metal is a weldable metal.

According to an embodiment, the flow inverter comprises a second plate extending along the main extension plane. For example, the second plate extends substantially along the lateral directions. Here and in the following “substantially” means that the second plate can enclose an angle with the main extension plane of at most 30° or 15°, e.g. 5° or 1°.

Exemplarily, the first plate and the second plate comprise or consist of the same material, i.e. the second plate comprises or consists of the metal or the polymer of the first plate. For example, the first plate and the second plate are formed from one piece. Alternatively, the first plate and the second plate comprise different materials.

According to an embodiment, the flow inverter comprises a first wall provided on the first plate and the second plate from a first main side of the flow inverter. The first wall exemplarily extends from a top surface of the first plate in vertical direction pointing away from the first plate.

The first wall exemplarily comprises or consists of a metal or a polymer. For example, the first wall comprises the same material as the first plate. Alternatively, the first wall comprises a different material as the first plate.

The first wall is, for example, formed in one piece with the first plate. Alternatively, the first wall is welded on the first plate or the first wall is fixed by other joining methods on the first plate.

According to an embodiment, the flow inverter comprises a second wall provided on the first plate and the second plate from a second main side of the flow inverter opposite the first main side. The first wall exemplarily extends from a bottom surface of the second plate in vertical direction pointing away from the second plate.

This is to say that the first plate comprises a top surface, and a bottom surface, arranged opposite to one another. The top surface of the first plate and the bottom surface of the first plate are connected via side surfaces of the first plate. Further, the second plate comprises a top surface, and a bottom surface, arranged opposite to one another. The top surface of the second plate and the bottom surface of the second plate are connected via side surfaces of the second plate. The top surface of the first plate is arranged opposite the bottom surface of the second plate.

For example, the first plate and the second plate are connected to one another by the first wall and the second wall. For example, the first wall is provided on the first plate in the side regions of the flow inverter and the first wall is provided on the second plate in a central region of the flow inverter. Exemplarily, the second wall is provided on the first plate in the central region of the flow inverter and the second wall is provided on the second plate in the side regions of the flow inverter. This is to say that the first wall protrudes in lateral directions beyond the first plate and that the second wall protrudes in lateral directions beyond the second plate, in an extension direction of the flow inverter.

According to an embodiment of the flow inverter, the first plate is provided next to the second plate. Exemplarily, the first plate is directly adjacent to the second plate. For example, the second plate and the first plate are arranged consecutively alongside one another in the extension direction of the flow inverter, e.g. in the order indicated. For example, the first plate and the second plate are in direct contact to one another. Exemplarily, the first plate and the second plate are connected to one another in a mechanically stable manner.

According to an embodiment of the flow inverter, at least one first recess is provided between the first plate and the second plate.

According to a further embodiment of the flow inverter, the at least one first recess is provided in a central region of the flow inverter.

Exemplarily, the second plate comprises a first recess in a central region of the flow inverter. E.g., the first recess completely penetrates the second plate in vertical direction from the top surface to the bottom surface. The central region is positioned in a region between the first plate and the second plate. Furthermore, the central region has a distance to side surfaces delimiting the flow inverter, for example.

According to an embodiment of the flow inverter, at least one second recess is provided between the first plate and the second plate.

According to a further embodiment of the flow inverter, the at least one second recess is provided in at least one side region of the flow inverter.

E.g., the first plate comprises at least one second recess in at least one side region of the flow inverter. Exemplarily, the at least one second recess completely penetrates the first plate in vertical direction from the top surface to the bottom surface. The at least one side region is positioned in a region of at least one side surface delimiting the flow inverter. Furthermore, the at least one side region is directly adjacent to the at least one side surface of the flow inverter, for example.

In summary, such a flow inverter for a coolant substance for a power semiconductor component having such a first recess and at least one second recess can provide, inter alia, the following advantages. If such a flow inverter is used in a cooling chamber on which power semiconductor modules are arranged, the current rating is advantageously achieved because the power semiconductor modules can be cooled effectively as described in more detail below. Exemplary, only the cooling of the last power semiconductor modules in the row is improved, but this power semiconductor modules defines the maximum allowed losses and consequently the current capability of the complete setup. Furthermore, a homogeneity of cooling of all power semiconductor modules can be improved. This is also advantageous with respect to a reduced demand of power modules as well as a higher reliability. This results in a cost-down due to the opportunity for a reduction in the number of chips in the power modules.

The positive impact can be evident in low flow rate regimes, where a temperature increase of the coolant substance is very high. Such a temperature increase of even more than 60 K is possible between an outlet port and an inlet port e.g. in the situation where a low coolant substance temperature is below 0° C. at the inlet port.

According to a further embodiment of the flow inverter, the first plate and the second plate extend parallel to one another. For example, the first plate and the second plate extend in a common plane. Exemplarily, the common plane extends parallel to the lateral directions.

According to a further embodiment of the flow inverter, the first wall completely extends along a width of the first plate. The width of the first plate is exemplarily defined by a minimal extent of the first plate in lateral directions perpendicular to the extension direction.

In this embodiment, the first wall extends completely from a first side surface of the first plate to a second side surface of the first plate. The first side surface of the first plate is exemplarily arranged opposite the second side surface of the first plate. The first side surface and/or the second side surface can extend parallel to the extension direction. Alternatively, the first side surface and/or the second side surface have an angle to the extension direction.

The second plate comprises a first side surface extending in the extension direction and a second side surface extending in the extension direction. The first side surface of the second plate is exemplarily arranged opposite the second side surface of the second plate. Further, the first side surfaces of the first plate and the second plate extend in a common direction and the second side surfaces of the first plate and the second plate extend in a further common direction.

Exemplarily, the flow inverter comprises a first side surface delimiting the flow inverter in a first side region being formed from the first side surface of the first plate and the first side surface of the second plate. Further, the flow inverter comprises a second side surface delimiting the flow inverter in a second side region being formed from the second side surface of the first plate and the second side surface of the second plate.

For example, the first wall terminates flush with the first side surface of the first plate and the second side surface of the first plate.

According to a further embodiment of the flow inverter, the second wall completely extends along a width of the second plate. The width of the second plate is exemplarily defined by a minimal extent of the second plate in lateral directions perpendicular to the extension direction.

In this embodiment, the second wall extends completely from the first side surface of the second plate to the second side surface of the second plate. For example, the second wall terminates flush with the first side surface of the second plate and the second side surface of the second plate.

According to a further embodiment of the flow inverter, the first wall has a first curved shape in plan view. For example, the first curved shape has the form of a semicircle, a half of a polygon or a triangle without a base.

For example, the first wall comprises at least two first partial walls being connected to one another. If there are two partial walls, a connection portion is located in the central part. The at least two first partial walls each extend straight or curved in lateral directions. For example, the at least two first partial walls enclose an angle with one another being smaller than 180°, exemplarily 160°. For example, the enclosed angle of the at least two first partial walls faces the first plate.

For example, the first wall comprises more than two first partial walls. Directly adjacent first partial walls enclose an angle being smaller than 1800 with one another. The enclosed angles of directly adjacent first partial walls can be different to one another. For example, the first partial walls as well as the respective enclosed angles of directly adjacent first partial walls are formed symmetrically with respect to the extension direction extending through the central region. Alternatively, the first partial walls as well as the respective enclosed angles of directly adjacent first partial walls are formed asymmetrically with respect to the extension direction extending through the central region.

For example, the first wall comprises an even number of first partial walls, e.g. four first partial walls. Alternatively, the first wall comprises an uneven number of first partial walls, e.g. three first partial walls.

According to a further embodiment of the flow inverter, an outer surface of the first curved shape points in direction of the second plate. The first curved shape exemplary comprises the outer surface and an inner surface opposite the outer surface. The inner surface points in direction to a centre of the first curved shape.

Because of the shape of the first wall, the coolant substance can be effectively directed to the side regions of the flow inverter.

According to a further embodiment of the flow inverter, a region with the largest curvature of the first curved shape points in the direction of the second plate. For example, the region with the largest curvature of the first curved shape is positioned in the central region. Exemplarily, directly adjacent first partial walls in the central region have the smallest enclosing angle and thus have the largest curvature.

According to a further embodiment of the flow inverter, the second wall has a second curved shape in plan view. For example, the second curved shape has the form of a semicircle or a half of a polygon.

For example, the second wall comprises at least two second partial walls being connected to one another. The at least two second partial walls each extend straight or curved in lateral directions. For example, the at least two second partial walls enclose an angle with one another being smaller than 180°, exemplarily 160°. For example, the enclosed angle of the at least two second partial walls faces the second plate.

For example, the second wall comprises more than two second partial walls. Directly adjacent second partial walls enclose an angle being smaller than 180° with one another. The enclosed angles of directly adjacent second partial walls can be different to one another. For example, the second partial walls as well as the respective enclosed angles of directly adjacent second partial walls are formed symmetrically with respect to the extension direction extending through the central region. Alternatively, the second partial walls as well as the respective enclosed angles of directly adjacent second partial walls are formed asymmetrically with respect to the extension direction extending through the central region.

For example, the second wall comprises an even number of first partial walls, e.g. four second partial walls. Alternatively, the second wall comprises an uneven number of first partial walls, e.g. three second partial walls.

According to a further embodiment of the flow inverter, an outer surface of the second curved shape points in the direction of the first plate. The second curved shape exemplary comprises the outer surface and an inner surface opposite the outer surface.

Because of the shape of the second wall, the coolant substance can be effectively directed to the central region of the flow inverter.

According to a further embodiment of the flow inverter, a region with the largest curvature of the second curved shape points in the direction of the first plate. For example, the region with the largest curvature of the second curved shape is positioned in the at least one side region. Exemplarily, directly adjacent second partial walls in the at least one side region have the smallest enclosing angle and thus have the largest curvature.

According to a further embodiment of the flow inverter, two second recesses are provided between the first plate and the second plate in two opposite side regions of the flow inverter. For example, the central region is arranged between two opposite side regions, exemplarily the first side region and the second side region of the flow inverter perpendicular to the extension direction.

According to a further embodiment of the flow inverter, the first recess is provided between the two second recesses. For example, a first second recess of the two second recesses is provided in the first side region and a second second recess of the two second recesses is provided in the second side region.

According to a further embodiment of the flow inverter, the first wall and the second wall overlap at least partly with one another in plan view, delimiting the first recess and the at least one second recess at least partly. For example, the first wall and the second wall have two overlapping points in plan view. The overlapping points define an extent of the first recess in lateral directions perpendicular to the extension direction in the central region. Further, the first wall and the second wall define an extent of the first recess in lateral direction in the extension direction in the central region. This is to say that the first recess is delimited by the first wall and the second wall in the central region.

One of the overlapping points and the first side surface or the second side surface of the flow inverter, closer to the overlapping point, define an extent of the at least one second recess in lateral directions perpendicular to the extension direction in plan view. Further, the second wall and the first wall define an extent of the at least one second recess in lateral direction in the extension direction in the at least one side region.

According to a further embodiment of the flow inverter, the first recess is provided on a side of the first wall facing the first plate.

According to a further embodiment of the flow inverter, the at least one second recess is provided on a side of the first wall facing the second plate.

A second aspect relates to a power semiconductor component, which can comprise the flow inverter described herein above. Therefore, features as described in connection with the flow inverter are also applicable for the power semiconductor component and vice versa.

According to an embodiment, the power semiconductor component comprises at least two power semiconductor modules, each being connected to a respective cooling structure. For example, each power semiconductor module comprises a bottom surface which is provided with one of the cooling structures. Exemplarily, in plan view each cooling structure overlaps at least partially or completely with a respective power semiconductor module.

Each power semiconductor module is, exemplarily, in direct contact to the cooling structure. Alternatively, a bond layer is arranged between each power semiconductor module and the cooling structure. Each cooling structure is configured, for example, to increase an area of the bottom surface of the respective power semiconductor module. For example, the cooling structures comprise or consist of copper, aluminium or a composite material comprising AlSiC or MgSiC.

For example, each cooling structure comprises a plurality of pin fins. For example, the pin fins of one of the cooling structures are facing away from the respective power semiconductor module in vertical direction. Each pin fin is, for example, formed from a pillar extending in vertical direction. Exemplarily, all of the pin fins have a common direction of extension being parallel to the vertical direction. For example, each pillar has a conical or cylindrical shape.

Alternatively each cooling structure comprises lamellas or rib structures. Each lamella extends in vertical direction having a tip facing away from the power semiconductor module. Further each lamella extends in lateral directions over a width or a length of the respective power semiconductor module. Each lamellas or each ribs are exemplary straight or each lamellas or each ribs have a specific geometry, e.g. wavy or zigzag, or irregular geometry.

According to an embodiment, the power semiconductor component comprises a cooling chamber having an inlet port and an outlet port. For example, the cooling chamber comprises a cover, at least two sidewalls, a front, a back and a bottom forming a cooling cavity. Exemplarily, the at least two sidewalls are connected in lateral directions via the front and the back. Exemplarily, the cover and the bottom are connected in vertical direction via the at least two sidewalls, the front and the back.

For example, the cooling structures are part of the power semiconductor modules. In this case, the cooling chamber, e.g. the cover, comprises at least two openings. On each of the openings, one of the power semiconductor modules with one of the cooling structures is arranged, wherein each cooling structure protrudes through a respective opening.

Alternatively, the cooling structures are part of the cooling chamber. In this case, all cooling structures are, exemplarily, part of the cover. For example, the cooling structures are formed integrally with cooling chamber. Exemplarily, the cooling chamber is a closed cooler.

It is possible that one of the at least two cooling structures protrudes through the at least one opening into the cooling chamber and the other of the at least two cooling structures are formed integrally with the cooling chamber.

According to an embodiment of the power semiconductor component, the cooling chamber is adapted for a flow direction of the coolant substance within the cooling chamber from the inlet port to the outlet port. The flow direction of the coolant substance is, for example, parallel to the extension direction of the flow inverter. Furthermore, the flow direction of the coolant substance is, for example, parallel to a main extension direction of the cooling chamber, i.e., along a main extension direction of the sidewalls, the cover and the bottom.

Exemplarily, the front is provided with the inlet port and the back is provided with the outlet port. Alternatively the bottom is provided with the inlet port and the outlet port. For example, in a region close to the front, the bottom is provided with the inlet port and in a region close to the back, the bottom is provided with the outlet port.

According to an embodiment of the power semiconductor component, each of the at least two cooling structures are provided within the cooling chamber consecutively in the direction of the flow direction. For example, each of the at least two cooling structures extend in vertical direction into the cooling chamber, i.e. the cavity. For example, the cooling structures extend from a plane of the cover in direction to the bottom within the cavity.

Exemplarily, a gap is formed between the cooling structures, e.g. an end of the cooling structures, and the bottom of the cooling chamber. This is to say that a bottom part close to the bottom of the cooling chamber is free of the cooling structures. The gap has a height in vertical direction, for example, of at most 2 mm, e.g. 0.8 mm. Alternatively, the gap is not present and the cooling structures are in direct contact with the bottom of the cooling chamber.

For example, each cooling structure is configured to form a flow resistance for the coolant substance flowing from the inlet port to the outlet port. For example, the flow resistance is higher closer to the cover in a top part where the cooling structures are provided than closer to the bottom part, where no cooling structures are provided. This is to say that a velocity of the coolant substance is higher in the bottom part than in the top part.

According to an embodiment of the power semiconductor component, the cooling chamber comprises a flow inverter being provided between two of the at least two cooling structures. If the power semiconductor component comprises more than two power semiconductor modules, and thus more than two coolant structures, the flow inverter is arranged between two adjacent cooling structures being closer to the outlet port. Exemplarily, the flow inverter is arranged between two adjacent cooling structures being closest to the outlet port.

For example, the power semiconductor component can also comprise more than one flow inverter. Each of the flow inverters are exemplarily provided between two neighbouring cooling structures. In this case, each of the flow inverters have the same form. Alternatively, at least one of the flow inverters is different from the rest of the flow inverters.

Exemplarily, the flow inverter is a part of the cooling chamber. In this case, the flow inverter is an integral part of the cooling chamber.

Alternatively, the flow inverter is mountable as a separate part within the cooling chamber. In this case, the flow inverter is welded, e.g. by a laser welding process, brazed or glued within the cooling chamber. Alternatively, the flow inverter is clamped within the cooling chamber or only laid in the cooling chamber.

Exemplarily, the first main side of the flow inverter faces the cover of the cooling chamber and the second main side of the flow inverter faces the bottom of the cooling chamber.

According to a further embodiment of the power semiconductor component, the flow inverter is configured to redirect the coolant substance flowing in a bottom part of the cooling chamber in flow direction before the flow inverter to a top part of the cooling chamber in flow direction after the flow inverter.

According to a further embodiment of the power semiconductor component, the flow inverter is configured to redirect the coolant substance flowing in a top part of the cooling chamber in flow direction before the flow inverter to a region close to a bottom part of the cooling chamber in flow direction after the flow inverter.

Exemplary, the coolant substance has a temperature gradient in vertical direction. For example, the coolant substance has a first average temperature in the top part of the cooling chamber in flow direction before the flow inverter and a second average temperature in the bottom part of the cooling chamber in flow direction before the flow inverter. Exemplarily, the first average temperature is higher than the average second average temperature since the cooling structures dissipate more heat to the coolant substance in the top part. Advantageously, the flow inverter is configured to invert portions of the coolant substance having different average temperatures in vertical direction.

Exemplarily, the coolant substance proportion with a higher average temperature flowing in the top part in flow direction before the flow inverter is blocked via the first wall, which directs this coolant substance to the at least one second recess. Furthermore, the coolant substance proportion with a lower average temperature flowing in the bottom part in flow direction before the flow inverter is blocked via the second wall, which directs this coolant substance to the at least one first recess.

The proportion of the coolant substance being directed to the at least one second recess is redirected to the bottom part of the cooling chamber in flow direction after the flow inverter. The proportion of coolant substance being directed to the first recess is redirected to the top part of the cooling chamber in flow direction after the flow inverter.

Further, the proportion of the coolant substance being directed to the first recess is redirected to a central part of the cooling chamber in flow direction after the flow inverter. The proportion of coolant substance being directed to the at least one second recess is redirected to a side part of the cooling chamber in flow direction after the flow inverter.

Advantageously, power semiconductor modules arranged in flow direction after the flow inverter can be cooled more effectively—compared with an arrangement without a flow inverter—due to such an inversion of the coolant substance in the top part and the bottom part. Exemplary, a more homogeneous cooling, e.g. the cooling of a last power semiconductor module in flow direction, is more effective, wherein this power semiconductor modules defines the maximum allowed current of the complete setup.

According to a further embodiment of the power semiconductor component the flow inverter of the power semiconductor component is a flow inverter described herein above.

According to a further embodiment of the power semiconductor component, the first plate is closer to the outlet port and the second plate is closer to the inlet port. This is to say that the extension direction of the flow inverter points in the flow direction.

According to a further embodiment of the power semiconductor component, the first plate extends parallel to a cover and a bottom of the cooling chamber.

According to a further embodiment of the power semiconductor component, the second plate extends parallel to a cover and a bottom of the cooling chamber.

According to a further embodiment of the power semiconductor component, the first wall extends perpendicular to a cover and a bottom of the cooling chamber. Alternatively, the first wall extends oblique to the cover and the bottom of the cooling chamber.

According to a further embodiment of the power semiconductor component, the second wall extends perpendicular to a cover and a bottom of the cooling chamber. Alternatively, the second wall extends oblique to the cover and the bottom of the cooling chamber.

According to a further embodiment of the power semiconductor component, the first wall extends from a first side surface of the cooling chamber to a second side surface of the cooling chamber. Exemplarily, the first side surface of the flow inverter is in direct contact to the first side surface of the cooling chamber. Further, the second side surface of the flow inverter is exemplarily in direct contact to the second side surface of the cooling chamber. For example, due to production tolerances, the first wall is only partially in direct contact to the first side surface of the cooling chamber and to the second side surface of the cooling chamber. Alternatively, the first wall is not in direct contact to the first side surface of the cooling chamber and to the second side surface of the cooling chamber For example, the first wall extends up to the cover of the cooling chamber. Exemplarily, the first wall is in direct contact to the cover of the cooling chamber. For example, the first wall is, due to production tolerances, at least partially in direct contact to the cover of the cooling chamber. Alternatively, the first wall is not in direct contact to the cover of the cooling chamber.

According to a further embodiment of the power semiconductor component, the second wall extends from the first side surface of the cooling chamber to the second side surface of the cooling chamber. For example, due to production tolerances, the second wall is only partially in direct contact to the first side surface of the cooling chamber and to the second side surface of the cooling chamber. Alternatively, the second wall is not in direct contact to the first side surface of the cooling chamber and to the second side surface of the cooling chamber.

For example, the second wall extends up to the bottom of the cooling chamber. Exemplarily, the second wall is in direct contact to the bottom of the cooling chamber. For example, the second wall is, due to production tolerances, at least partially in direct contact to the bottom of the cooling chamber. Alternatively, the second wall is not in direct contact to the bottom of the cooling chamber.

This is to say that the flow inverter divides the cooling chamber, e.g. the cavity, in a first part closer to the inlet port and a second part closer to the outlet port. Exemplarily, the first part and the second part are connected to one another solely by the first recess and the at least one second recess of the flow inverter.

Furthermore, a method for producing a power semiconductor component is described here, with which a power semiconductor component as described herein above can be produced or is produced. Therefore, the features in connection with the power semiconductor component is disclosed also in connection with the method and vice versa.

According to an embodiment of the method, at least two power semiconductor modules are provided, each being connected to a respective cooling structure.

According to an embodiment of the method, a cooling chamber having an inlet port and an outlet port is provided.

According to an embodiment of the method, the at least two power semiconductor modules are arranged on the cooling chamber.

According to an embodiment of the method, a flow inverter is arranged between two of the at least two cooling structures.

For example, the flow inverter is formed form one piece and is arranged in the cooling cavity. In this case, the flow inverter can be welded or glued to the cooling chamber. Alternatively, the flow inverter is clamped within the cooling chamber or only laid in the cooling chamber.

Alternatively, the flow inverter is at least partly formed from parts of the cooling chamber. For example, the first wall is part of the cover and/or the second wall is part of the bottom. The first wall and/or the second wall are/is exemplary welded, glued, brazed or clamped to the first plate and/or to the second plate. Additionally, the first wall is exemplary welded, brazed or glued to the cover or is formed integrally with the cover. Additionally, the second wall is exemplary welded, brazed or glued to the bottom or is formed integrally with the bottom.

According to a further embodiment of the method, the flow inverter is configured to redirect the coolant substance flowing in a bottom part of the cooling chamber in flow direction before the flow inverter to a top part of the cooling chamber in flow direction after the flow inverter.

According to a further embodiment of the method, the flow inverter is configured to redirect the coolant substance flowing in a top part of the cooling chamber in flow direction before the flow inverter to a region close to a bottom part of the cooling chamber in flow direction after the flow inverter.

According to a further embodiment of the method, the flow inverter is arranged in the cooling chamber by at least one of welding, soldering, clamping, brazing, gluing or insertion as separate part.

The accompanying figures are included to provide a further understanding. In the figures, elements of the same structure and/or functionality may be referenced by the same reference signs. It is to be understood that the embodiments shown in the figures are illustrative representations and are not necessarily drawn to scale.

Figure 2:
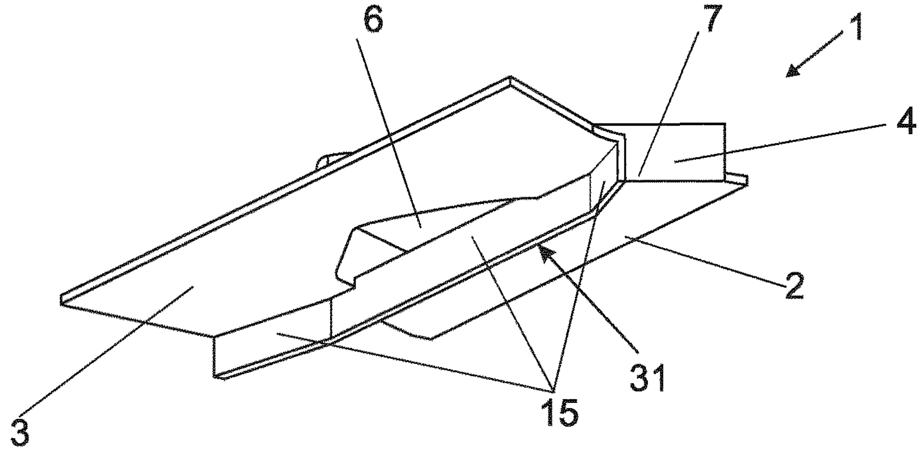
Figure 3:
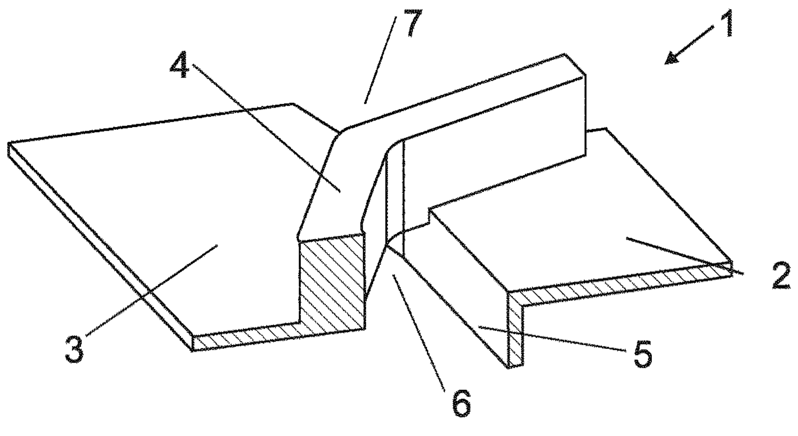
Figure 4:
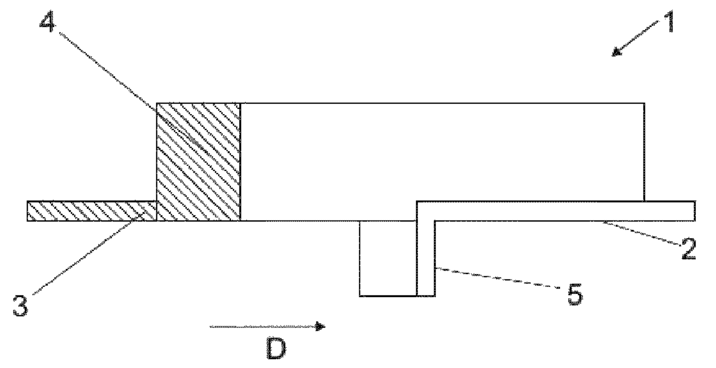
Figure 5:
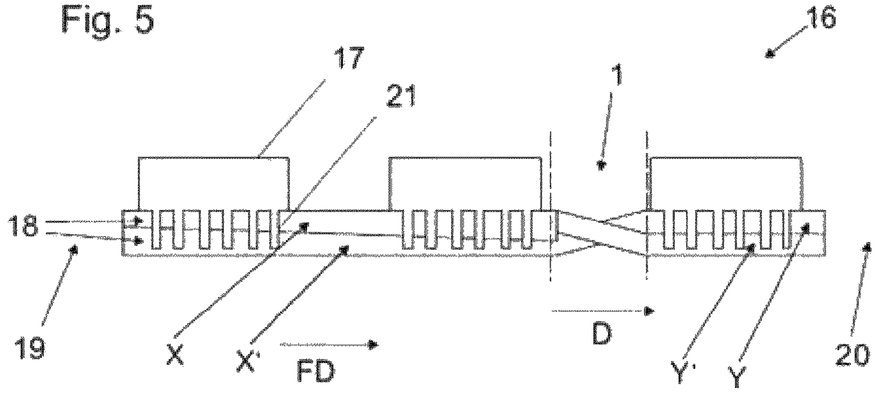
Figure 6:
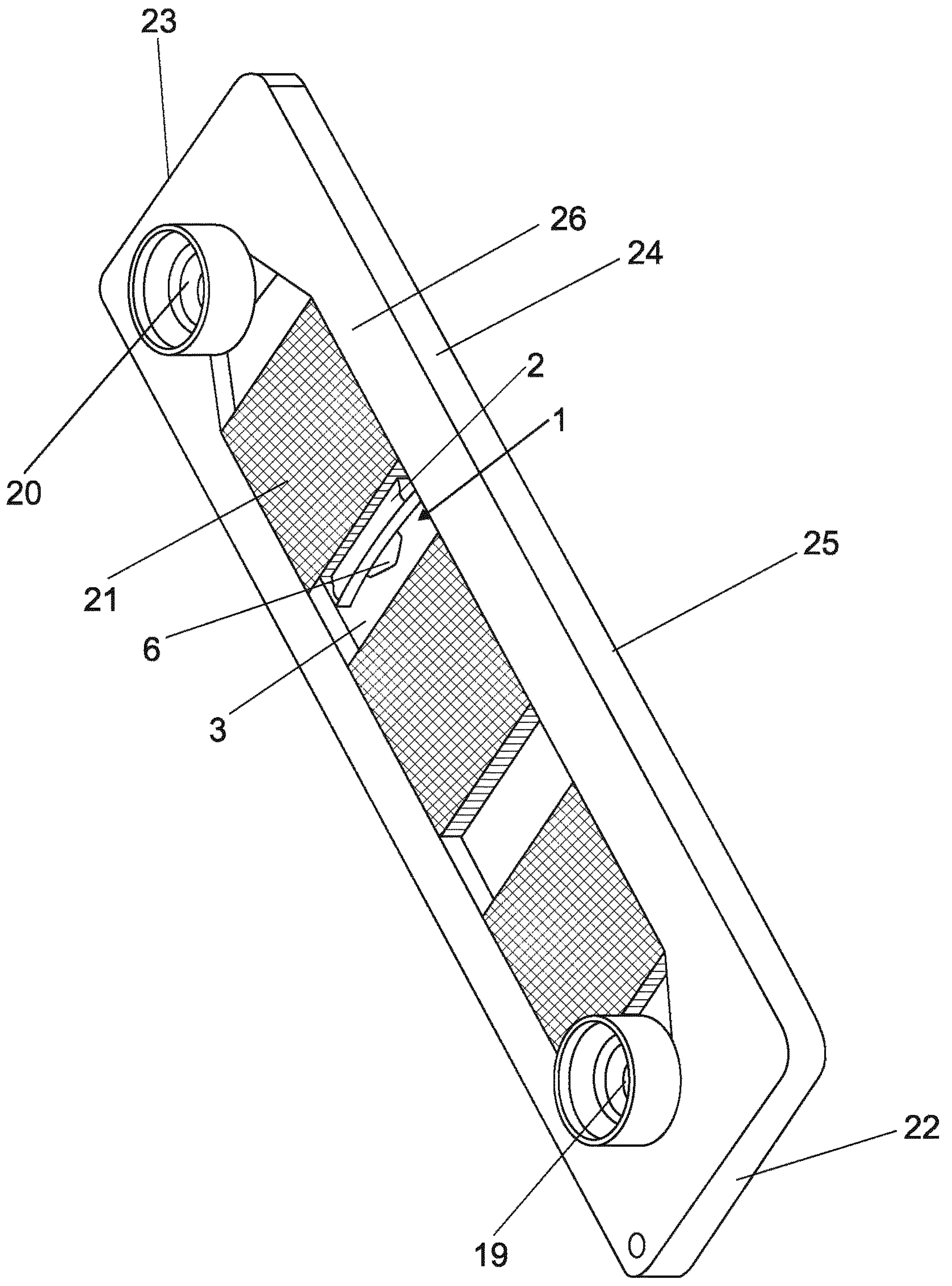

FIG. 1 is a three dimensional schematic top view of a flow inverter according to an exemplary embodiment, FIG. 2 is a three dimensional schematic bottom view of a flow inverter according to an exemplary embodiment, FIGS. 3 and 4 are each sectional views of a flow inverter according to an exemplary embodiment, FIG. 5 is a sectional view of a power semiconductor component according to an exemplary embodiment, and FIG. 6 is a three dimensional schematic top view of a power semiconductor component according to an exemplary embodiment.

The flow inverter 1 according to FIG. 1 comprises a first plate 2 and a second plate 3. The second plate 3 and the first plate 2 are arranged consecutively adjacent to one another along an extension direction D, in the order indicated. A first wall 4 is arranged on the first plate 2, e.g. an edge of the first plate 2, in two side regions 13 of the flow inverter 1 from a first main side and on the second plate 3, e.g. an edge of the second plate 3, in a central region 12 from a second main side. Furthermore, a second wall 5 is arranged on the second plate 3 in the side regions 13 of the flow inverter 1 and on the first plate 2 in the central region 12 of the flow inverter 1.

The first plate 2 has a first side surface 8 and a second side surface 9 and the second plate 3 has a first side surface 10 and a second side surface 11. The first side surface 8 and the second side surface 9 of the first plate 2 are arranged opposite to one another. Further, the first side surface 10 and the second side surface 11 of the second plate 3 are arranged opposite to one another. The first side surface of the first plate 8 and the first side surface of the second plate 10 form a first side surface of the flow inverter 1. Further, the second side surface of the first plate 9 and the second side surface of the second plate 11 form a second side surface of the flow inverter 1. Both the first side surface of the flow inverter 1 and the second side surface of the flow inverter 1 extend along the extension direction D.

The first wall 4 completely extends from the first side surface of the first plate 8 to the second side surface of the first plate 9. Furthermore, the second wall 5 completely extends from the first side surface of the second plate 10 to the second side surface of the second plate 11.

The first wall 4 comprises four first partial walls 14, wherein directly adjacent first partial walls 14 are directly connected to one another, e.g. being formed in one piece. Directly adjacent first partial walls 14 enclose an angle with one another. Here, the enclosing angles are all the same. Thus, the first wall 4 has a first curved shape in plan view. In this exemplary embodiment, the first curved shape is half of an octagon. An outer surface of the first curved shape 30 points in the direction of the second plate 3.

A first recess 6 is provided between the first plate 2 and the second plate 3 in the central region 12. The first recess 6 completely penetrates the second plate 3 in the central region 12. Further, two second recesses 7 are provided between the first plate 2 and the second plate 3. Each of the two second recesses 7 completely penetrates the first plate 2 in the side regions 13. The first recess 6 is provided between the two second recesses 7 perpendicular to the extension direction D.

The first wall 4 and the second wall 5 overlap at least partly with one another in plan view, delimiting the first recess 6 and the two second recesses 7 at least partly. Thus, the first recess 6 is delimited by the first wall 4 and the second wall 5 in the central region 12.

According to FIG. 2, the second wall 5 comprises three second partial walls 15, wherein directly adjacent second partial walls 15 are directly connected to one another, e.g. being formed in one piece. Directly adjacent second partial walls 15 enclose an angle with one another. Here, the enclosing angles are all the same. Thus, the second wall 5 has a second curved shape in plan view. An outer surface of the second curved shape 31 points in the direction of the first plate 2.

Further, each second recess 7 is delimited by the first wall 4 and the second wall 5 in the respective side region 13 and by the projection of the outer surface of the flow inverter in plan view.

The flow inverter 1 according to FIGS. 3 and 4 comprises the first plate 2 and the second plate 3, wherein the first plate 2 and the second plate 3 extend in a common plane.

The first wall 4 and the second wall 5 each extend in a direction perpendicular to the extension direction D of the flow inverter 1.

The first plate 2 and the second plate 3 as well as the first wall 4 and the second wall 5 are formed in one piece, for example.

The power semiconductor component 16 of FIG. 5 comprises three power semiconductor modules 17, each being connected to a cooling structure 21, wherein each cooling structure 21 is part, e.g. an integral part, of a respective power semiconductor module 17.

The power semiconductor modules 17 are provided on and the respective cooling structure 21 are provided in a cooling chamber (not shown in FIG. 5) being described more detailed in connection with FIG. 6. The cooling chamber has an inlet port 19 and an outlet port 20 (not shown in FIG. 5) described in more detail in connection with FIG. 6. Furthermore, the cooling chamber is adapted for a flow direction FD of a coolant substance 18 within the cooling chamber from the inlet port 19 to the outlet port 20.

The power semiconductor modules 17 are provided on the cooling chamber consecutively along the flow direction FD. Thus, each of the cooling structures 21 are provided within the cooling chamber consecutively in the direction of the flow direction FD.

Furthermore, the flow inverter 1 according to FIGS. 1 to 4 is provided in the cooling chamber between two of the at least two cooling structures 21. A region where the flow inverter 1 is arranged is indicated in FIG. 5 by two dashed lines. Within the two dashed lines, the flow inverter 1 is arranged. In this exemplary embodiment, the flow inverter 1 is arranged between directly neighbouring power semiconductor modules 17 closest to the outlet port 20.

The coolant substance 18 has a first average temperature in a top part X of the cooling chamber in flow direction FD before the flow inverter 1 and a second average temperature in the bottom part X' of the cooling chamber in flow direction FD before the flow inverter 1. Here, the average first average temperature is higher than the average second average temperature since the cooling structures 21 dissipate more heat to the coolant substance 18 in the top part X.

The flow inverter 1 inverts the coolant substance 18 after the flow inverter 1 in flow direction FD in vertical direction. Hence, the portion of the coolant substance of the top part X is redirected to a bottom part Y' of the cooling chamber in flow direction FD after the flow inverter 1 and the portion of the coolant substance of the bottom part X' is redirected to a top part Y of the cooling chamber in flow direction FD after the flow inverter 1. Thus, the power semiconductor module 17 closest to the outlet port 20 can be cooled down effectively.

The power semiconductor component 16 of FIG. 6 has a cooling chamber comprising a cover 25, two sidewalls 24, a front 22, a back 23 and a bottom 26 forming a cooling cavity. The cooling structures 21 are located within the cooling cavity.

The flow inverter 1 is arranged as already described in connection with FIG. 5 between directly neighbouring cooling structures 21 closest to the outlet port 20. The second plate 3 faces the inlet port 19 and the first plate 2 faces the outlet port 20.

REFERENCE SIGNS

1 flow inverter
2 first plate
3 second plate
4 first wall
5 second wall
6 first recess
7 second recess
8 first side surface of the first plate
9 second side surface of the first plate
10 first side surface of the second plate
11 second side surface of the second plate
12 central region
13 side region
14 first partial wall
15 second partial wall
16 power semiconductor component
17 power semiconductor module
18 coolant substance

19 inlet port
20 outlet port
21 cooling structure
22 front
23 back
24 sidewall
25 cover
26 bottom
28 first main side
29 second main side
30 outer surface of the first curved shape
31 outer surface of the second curved shape
X top part before the flow inverter
X' bottom part before the flow inverter
Y top part after the flow inverter
Y' bottom part after the flow inverter
D extension direction
FD flow direction

What is claimed is:

1. A flow inverter for a coolant substance for a power semiconductor component with at least two power semiconductor modules and a cooling chamber, comprising:
- a first plate extending along a main extension plane of the flow inverter;
- a second plate extending along the main extension plane;
- a first wall provided on the first plate and the second plate from a first main side of the flow inverter; and
- a second wall provided on the first plate and the second plate from a second main side of the flow inverter opposite the first main side, wherein
- the first plate is provided next to the second plate,
- at least a first recess is provided between the first plate and the second plate, or
- at least a second recess is provided between the first plate and the second plate.

2. The flow inverter according to claim 1, wherein the first recess is provided in a central region of the flow inverter, and the second recess is provided in at least a side region of the flow inverter.

3. The flow inverter according to claim 1, wherein the first plate and the second plate extend parallel to one another.

4. The flow inverter according to claim 1, wherein the first wall completely extends along a width of the first plate, and the second wall completely extends along a width of the second plate.

5. The flow inverter according to claim 1, wherein at least one of the first wall has a first curved shape in plan view and an outer surface of the first curved shape points in direction of the second plate, or the second wall has a second curved shape in plan view, and an outer surface of the second curved shape points in the direction of the first plate.

6. The flow inverter according to claim 1, wherein two second recesses are provided between the first plate and the second plate in two opposite side regions of the flow inverter.

7. The flow inverter according to claim 6, wherein the first recess is provided between the two second recesses.

8. The flow inverter according to claim 1, wherein the first wall and the second wall at least partly overlap with one another in plan view delimiting the first recess and the second recess at least partly.

9. The flow inverter according to claim 1, wherein the first recess is provided on a side of the first wall facing the first plate, and the second recess is provided on a side of the first wall facing the second plate.

10. A power semiconductor component, comprising
- at least two power semiconductor modules, each being connected to a respective cooling structure; and
- a cooling chamber having an inlet port and an outlet port, wherein
- the cooling chamber is adapted for a flow direction (FD) of a coolant substance within the cooling chamber from the inlet port to the outlet port,
- each of the at least two cooling structures are provided within the cooling chamber consecutively in direction of the flow direction (FD), and
- the cooling chamber comprises a flow inverter being provided between two of the at least two cooling structures, the flow inverter comprising:
  - a first plate extending along a main extension plane of the flow inverter;
  - a second plate extending along the main extension plane;
  - a first wall provided on the first plate and the second plate from a first main side of the flow inverter; and
  - a second wall provided on the first plate and the second plate from a second main side of the flow inverter opposite the first main side, wherein the first plate is provided next to the second plate, at least a first recess is provided between the first plate and the second plate, or at least a second recess is provided between the first plate and the second plate.

11. The power semiconductor component according to claim 10, wherein
- the first plate is closer to the outlet port, and
- the second plate is closer to the inlet port.

12. The power semiconductor component according to claim 10, wherein at least one of
- the first plate extends parallel to a cover and a bottom of the cooling chamber,
- the second plate extends parallel to a cover and a bottom of the cooling chamber
- the first wall extends perpendicular to a cover of the cooling chamber, or
- the second wall extends perpendicular to a bottom of the cooling chamber.

13. The power semiconductor component according to claim 10, wherein
- the first wall extends from a first side surface of the cooling chamber to a second side surface of the cooling chamber, and
- the second wall extends from the first side surface of the cooling chamber to the second side surface of the cooling chamber.

14. A method for producing a power semiconductor component, comprising:
- providing at least two power semiconductor modules, each being connected to a respective cooling structure;
- providing a cooling chamber having an inlet port and an outlet port;
- arranging the at least two at least two power semiconductor modules on the cooling chamber; and
- arranging a flow inverter between two of the at least two cooling structures, the flow inverter comprising:
  - a first plate extending along a main extension plane of the flow inverter;
  - a second plate extending along the main extension plane;
  - a first wall provided on the first plate and the second plate from a first main side of the flow inverter; and
  - a second wall provided on the first plate and the second plate from a second main side of the flow inverter opposite the first main side, wherein the first plate is provided next to the second plate, at least a first recess is provided between the first plate and the second plate, or at least a second recess is provided between the first plate and the second plate.

15. The method according to claim 14, wherein the flow inverter is arranged in the cooling chamber by at least one of welding, soldering, clamping, brazing, gluing, or insertion as a separate part.

* * * * *